United States Patent
Higashiki et al.

(10) Patent No.: US 8,174,669 B2
(45) Date of Patent: May 8, 2012

(54) LIQUID IMMERSION OPTICAL TOOL, METHOD FOR CLEANING LIQUID IMMERSION OPTICAL TOOL, LIQUID IMMERSION EXPOSURE METHOD AND METHOD FOR MANUFACTURING SEMICONDUCTOR DEVICE

(75) Inventors: Tatsuhiko Higashiki, Fujisawa (JP); Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 12/510,009

(22) Filed: Jul. 27, 2009

(65) Prior Publication Data

US 2009/0284718 A1 Nov. 19, 2009

Related U.S. Application Data

(60) Division of application No. 11/504,053, filed on Aug. 15, 2006, now abandoned, which is a continuation-in-part of application No. 11/217,464, filed on Sep. 2, 2005, now abandoned.

(30) Foreign Application Priority Data

Sep. 6, 2004 (JP) ................................ 2004-258676

(51) Int. Cl.
  *G03B 27/52* (2006.01)
  *G03B 27/42* (2006.01)
(52) U.S. Cl. ........................................... 355/30; 355/53
(58) Field of Classification Search .................... 355/30, 355/53, 67; 250/548
See application file for complete search history.

(56) References Cited

U.S. PATENT DOCUMENTS

| 5,610,683 | A   | * | 3/1997 | Takahashi ........................ 355/53 |
| 6,496,257 | B1  |   | 12/2002 | Taniguchi et al. |
| 6,813,004 | B1  |   | 11/2004 | Horikoshi et al. |
| 7,061,575 | B2  | * | 6/2006 | Taniguchi et al. ............... 355/30 |
| 7,119,874 | B2  |   | 10/2006 | Cox et al. |
| 7,362,412 | B2  | * | 4/2008 | Holmes et al. ................... 355/30 |
| 7,804,576 | B2  | * | 9/2010 | Fujiwara et al. ................. 355/30 |
| 7,880,860 | B2  | * | 2/2011 | Jansen et al. .................... 355/30 |
| 2005/0217703 | A1 |  | 10/2005 | O'Donnell |
| 2007/0247601 | A1 | * | 10/2007 | Hazelton et al. ................. 355/30 |

FOREIGN PATENT DOCUMENTS

JP 11-162831 6/1999

(Continued)

OTHER PUBLICATIONS

Notice of Reasons for Rejection mailed on Nov. 17, 2009, by the Japanese Patent Office in copending Application No. 2004-258676 and English translation thereof.

(Continued)

*Primary Examiner* — Hung Henry Nguyen
(74) *Attorney, Agent, or Firm* — Finnegan, Henderson, Farabow, Garrett & Dunner, L.L.P.

(57) ABSTRACT

There is disclosed is a liquid immersion optical tool, which comprises a light source, an optical lens system, a stage which moves an object base on which an object is to be placed, a head comprising a liquid immersion medium fluid supply device and a liquid immersion medium fluid discharge device to provide a layer of liquid immersion medium fluid between the optical lens system and the object, a fence which limits a region of the layer of liquid immersion medium fluid, and a cleaning device which cleans a portion having been contacted with the liquid immersion medium fluid by means of a cleaning solution.

12 Claims, 11 Drawing Sheets

FOREIGN PATENT DOCUMENTS

| | | |
|---|---|---|
| JP | 2002-118085 | 4/2002 |
| JP | 2005-277363 | 10/2005 |
| JP | 2006-032750 | 2/2006 |
| WO | WO 99/49504 | 9/1999 |
| WO | WO 2004/050266 | 6/2004 |
| WO | WO 2004/093130 | 10/2004 |

OTHER PUBLICATIONS

Tsujimura, et al., "Development of Semi-Conductor Device Cleaning by Cavitation Jet", Japanese Machinery Society (Edition B), vol. 67, Issue 653, pp. 88-94, (2001).

* cited by examiner

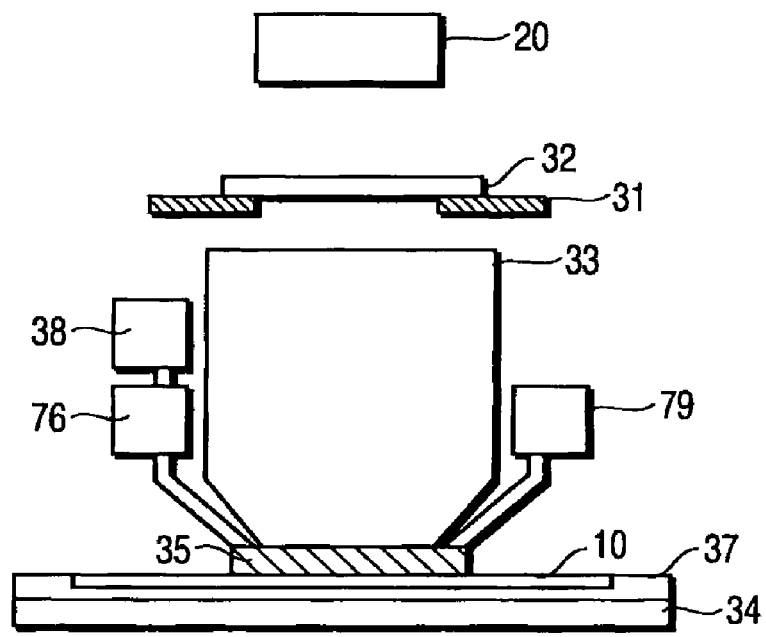
F I G. 7
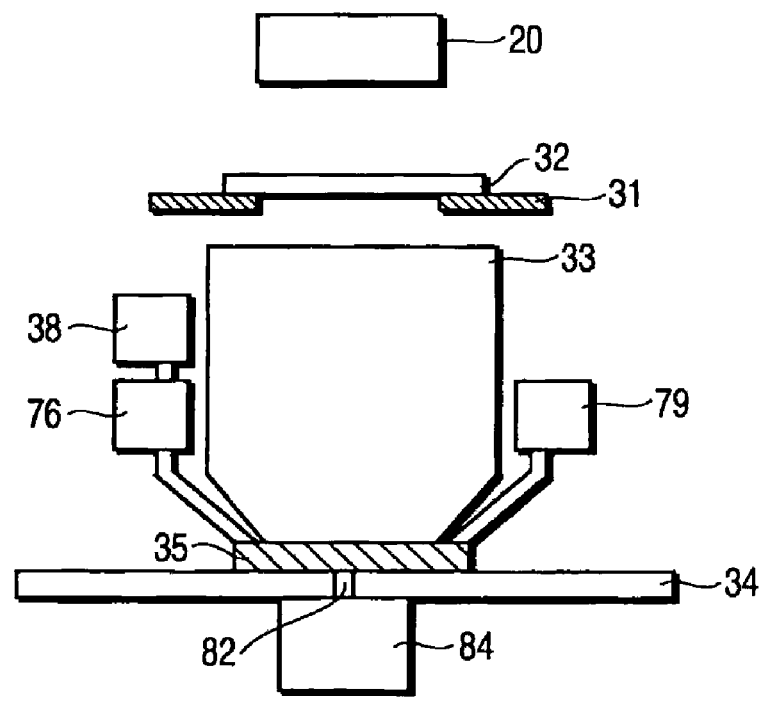
F I G. 8

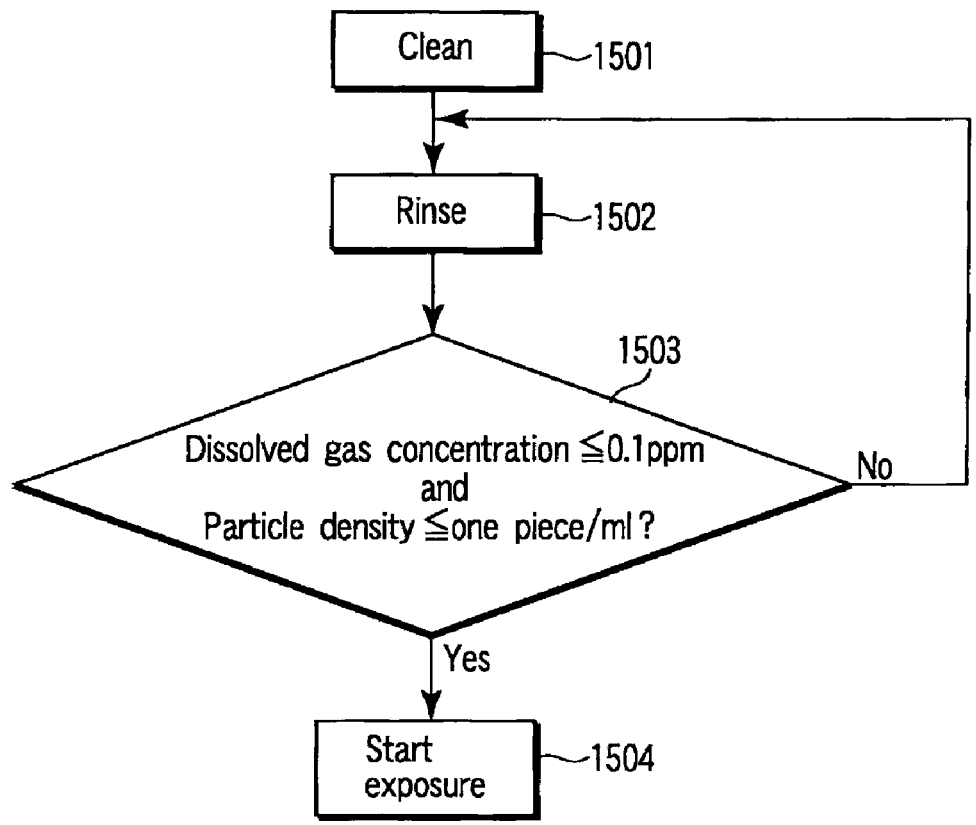
F I G. 21
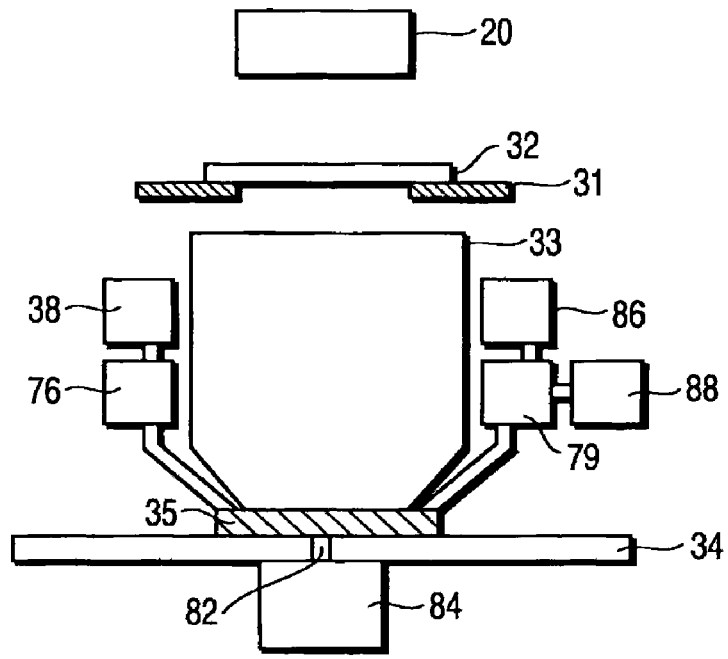
F I G. 22

LIQUID IMMERSION OPTICAL TOOL, METHOD FOR CLEANING LIQUID IMMERSION OPTICAL TOOL, LIQUID IMMERSION EXPOSURE METHOD AND METHOD FOR MANUFACTURING SEMICONDUCTOR DEVICE

CROSS-REFERENCE TO RELATED APPLICATIONS

This application is a division of application Ser. No. 11/504,053, filed on Aug. 15, 2006 now abandoned, which is a continuation-in-part of application Ser. No. 11/217,464, filed on Sep. 2, 2005 now abandoned, which claim the benefit of priority to prior Japanese Patent Application No. 2004-258676, filed on Sep. 6, 2004, the entire disclosures of which are incorporated herein by reference.

BACKGROUND OF THE INVENTION

1. Field of the Invention

The present invention relates to a liquid immersion optical tool, a method for cleaning the liquid immersion optical tool, a liquid immersion exposure method and a method for manufacturing a semiconductor device, wherein a liquid immersion medium fluid layer is provided between an optical lens system and an object, improving an optical performance.

2. Description of the Related Art

A liquid immersion microscope or a liquid immersion exposure tool and the like is used as a liquid immersion optical tool for immersing liquid immersion medium fluid between an object and an optical lens system, thereby improving a resolution and a depth of focus. In a liquid immersion microscope, a liquid immersion medium liquid such as oil or water is provided between an objective lens of the microscope and an object, thereby improving a resolution and a depth of focus. In a liquid immersion exposure tool for use in a semiconductor lithography process, a liquid immersion medium fluid is provided between a lens and a wafer, thereby making it possible to increase NA (Numerical Aperture) and to increase a depth of focus. This exposure tool is expected to be a main exposure tool in manufacturing a semiconductor device in a generation following a 65 nm half pitch generation (WO 99/49504).

The lens of the liquid immersion optical tool is in contact with liquid immersion medium fluid for a long time when the liquid immersion optical tool is used. Thus, there is a problem that substances generated from the tool, the object surface, and a structure for guiding the liquid immersion medium fluid react with each other to adhere to the lens so that the lens surface is clouded. This clouding of the lens surface is problematic because it degrades the resolution and the luminescence.

In addition, there is a problem that the substance or impurities adhered to the lens or members of the tool contaminate the object surface.

In addition, portions having been contacted with the liquid immersion medium fluid include a liquid immersion head, an object stage, and a liquid immersion medium fluid supply and discharge device. There is a problem that, when the liquid immersion optical tool is used for a long time, impurities adhere to their associated portions, and the adhered impurities reach an object and contaminate the object surface.

Furthermore, there is a problem that, when the liquid immersion medium fluid supplied between the lens and the wafer is not clean before and during exposure, the exposure cannot be properly carried out.

BRIEF SUMMARY OF THE INVENTION

According to a first aspect of the present invention, there is provided a liquid immersion optical tool comprising:
 a light source;
 an optical lens system;
 a stage which moves an object base on which an object is to be placed;
 a head comprising a liquid immersion medium fluid supply device and a liquid immersion medium fluid discharge device to provide a layer of liquid immersion medium fluid between the optical lens system and the object;
 a fence which limits a region of the layer of liquid immersion medium fluid; and
 a cleaning device which cleans a portion having been contacted with the liquid immersion medium fluid by means of a cleaning solution.

According to a second aspect of the present invention, there is provided a cleaning method in the liquid immersion optical tool comprising a light source; an optical lens system; a stage which moves an object base on which an object is to be placed; a head comprising a liquid immersion medium fluid supply device and a liquid immersion medium fluid discharge device to provide a layer of liquid immersion medium fluid between the optical lens system and the object; a fence which limits a region of the layer of liquid immersion medium fluid; and a cleaning device which cleans a portion having been contacted with the liquid immersion medium fluid by means of a cleaning solution,
 wherein the portion having been contacted with the liquid immersion medium fluid is cleaned for a predetermined time by means of the cleaning device.

According to a third aspect of the present invention, there is provided a semiconductor device manufacturing method in which a semiconductor device is manufactured by using a liquid immersion exposure tool, the liquid immersion exposure tool comprising:
 a light source;
 an optical lens system;
 a stage which moves an object base on which an object is to be placed;
 a head comprising a liquid immersion medium fluid supply device and a liquid immersion medium fluid discharge device to provide a layer of liquid immersion medium fluid between the optical lens system and the object;
 a fence which limits a region of the layer of liquid immersion medium fluid; and
 a cleaning device which cleans a portion having been contacted with the liquid immersion medium fluid by means of a cleaning solution.

According to a fourth aspect of the present invention, there is provide a liquid immersion optical tool comprising:
 a light source;
 an optical lens system;
 a stage which moves an object base on which an object is to be placed;
 a liquid supply device which supplies a liquid immersion medium fluid or a cleaning solution between the optical lens system and the object;
 a liquid discharge device which discharges the liquid immersion medium fluid or the cleaning solution; and
 an ozone gas supplying device which is connected to the stage or the liquid supply device and supplies an ozone gas to the cleaning solution.

According to a fifth aspect of the present invention, there is provide a liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
a measuring device which is connected to the liquid discharge device and measures at least one of a dissolved gas concentration and a particle density of the liquid immersion medium fluid or the cleaning solution discharged by the liquid discharge device.

According to a sixth aspect of the present invention, there is provide a cleaning method which cleans an optical lens system in a liquid immersion optical tool comprising:
a light source;
the optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
an ozone gas supplying device connected to the stage or the liquid supply device, the method comprising:
cleaning the optical lens system by the cleaning solution in which an ozone gas is dissolved by supplying the ozone gas from the ozone gas supplying device to the cleaning solution.

According to a seventh aspect of the present invention, there is provide a liquid immersion exposure method in a liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or a cleaning solution; and
a measuring device which is connected to the liquid discharge device and measures a dissolved gas concentration in the liquid immersion medium fluid or the cleaning solution discharged by the liquid discharge device, the method comprising:
carrying out a liquid immersion exposure when the dissolved gas concentration measured by the measuring device is a predetermined concentration or less.

According to an eighth aspect of the present invention, there is provide a liquid immersion exposure method in a liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
a measuring device which is connected to the liquid discharge device and measures a particle density in the liquid immersion medium fluid or the cleaning solution discharged by the liquid discharge device, the method comprising:
carrying out a liquid immersion exposure when the particle density measured by the measuring device is a predetermined density or less.

BRIEF DESCRIPTION OF THE SEVERAL VIEWS OF THE DRAWING

FIG. 7 is a view showing a configuration at the time of exposure of a liquid immersion exposure tool according to a fourth embodiment of the present invention;

FIG. 8 is a view showing a configuration at the time of cleaning of the liquid immersion exposure tool according to the fourth embodiment of the present invention;

FIG. 21 is a flowchart of a liquid immersion exposure method according to the sixth embodiment of the present invention;

FIG. 22 is a view showing a configuration at the time of cleaning by ozone water, of the liquid immersion exposure tool according to the sixth embodiment of the present invention.

DETAILED DESCRIPTION OF THE INVENTION

Hereinafter, embodiments of the present invention will be described with reference to the accompanying drawings.

(First Embodiment)

Figure 1:
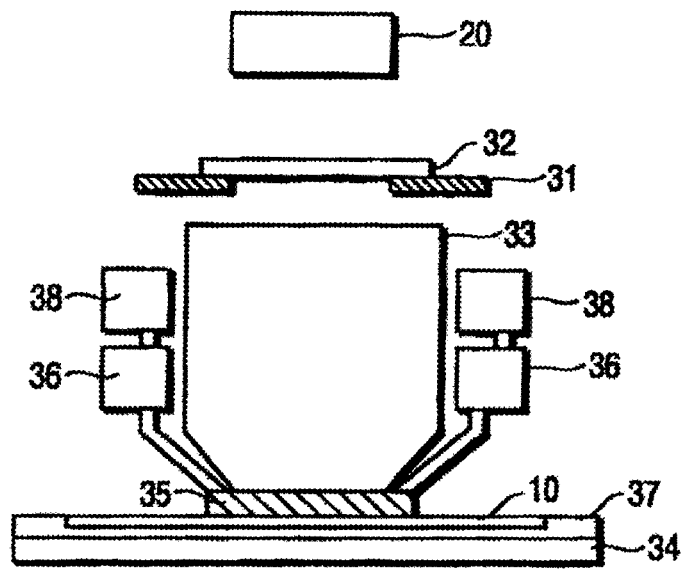
FIG. 1 is a view showing a configuration of a liquid immersion exposure tool according to a first embodiment of the present invention.

FIG. 1 is a view showing an outline configuration of a liquid immersion exposure tool according to a first embodiment of the present invention. A reticle stage 31 is provided under a lighting optical system (light source) 20. A reticle 32 which is a photo mask is placed on the reticle stage 31. The reticle stage 31 is movable in parallel to an object base 37 (i.e., in a horizontal direction in the exposure tool). A projection lens system (optical lens system) 33 is provided under the reticle stage 31. The object base 37 is provided under the projection lens system 33. A semiconductor substrate 10 is placed on the object base 37. The heights of the surface of the semiconductor substrate 10 and part of the object base 37 near the semiconductor substrate 10 are almost equal to each other. The object base 37 is movable together with a stage 34 and the semiconductor substrate 10 in the parallel direction and the orthogonal direction to the reticle stage 31 (i.e., horizontal and vertical directions in the exposure tool). The stage 34 can be inclined with respect to the horizontal plane.

A fence 35 is mounted at the lower part of the projection lens system 33. A liquid immersion medium fluid supply and discharge mechanism is provided at the side of the projection lens system 33. The supply and discharge mechanism comprises a pair of liquid immersion medium fluid supply and discharge devices 36 which supply liquid immersion medium fluid into the fence 35, and discharge the liquid immersion medium fluid from the fence 35. A structure of the liquid immersion medium fluid supply and discharge mechanism is not limited to this structure. When one of the pair of liquid immersion medium fluid supply and discharge devices 36 functions as a liquid immersion medium supply device, the other liquid immersion medium fluid supply and discharge device functions as a liquid immersion medium discharge device. That is, the pair of liquid immersion medium fluid supply and discharge devices 36 functions complementarily with respect to the supply and discharge of the liquid immersion medium fluid. During exposure, a space between the substrate 10 and the projection lens system 33 surrounded by the fence 35 is filled with a layer of liquid immersion medium fluid, for example, water, supplied from one of the liquid immersion medium fluid supply and discharge devices 36. Light of exposure emitted from a light source 20 reaches the semiconductor substrate 10 placed on the object base 37 via a mask pattern (i.e., a semiconductor element pattern) of the reticle 32, the projection lens system 33 and the liquid immersion medium fluid layer. In this manner, an image of the mask pattern of the reticle 32 is projected on a photo resist film provided on the semiconductor substrate 10 so that a latent image is formed on the photo resist film. A structure formed of the fence 35 and the pair of the light immersion medium fluid supply and discharge devices 36 is called a head.

A pair of cleaning devices 38 are connected to a pair of the liquid immersion medium fluid supply and discharge devices 36 in order to defog the projection lens system 33 and remove impurities adhered at the time of exposure. The pair of the cleaning devices 38 complementarily supply a cleaning solution into the fence 35 via the pair of the liquid immersion medium fluid supply and discharge devices 36. After exposure, the cleaning solution is supplied into the fence 35, whereby parts or portions having been contacted with the liquid immersion medium fluid supplied from the liquid immersion medium fluid supply device 36 are cleaned.

In a step and scan type exposure tool, all of the patterns on a photo mask are not collectively transferred to a resist laminate film. Only a pattern portion of the entire pattern of the photo mask, which is smaller than the entire pattern of the photo mask, is collectively transferred. The pattern portion is a slit shape predetermined area called an exposure field. Exposure is carried out in a state in which the photo mask and the substrate are moved at a rate according to a magnification of the projection optical system, whereby the photo mask and substrate are scanned by light ray to project the entire pattern of the photo mask onto the resist laminate film. The term "exposure field" may mean the predetermined area of the slit shape on the substrate plane which is optically conjugate with the pattern side on the photo mask.

A photo mask movement distance is greater than a substrate movement distance. Thus, in general, the number of photo mask movements is reduced in order to reduce an exposure process time. Therefore, it is general that relative movement directions of the photo mask and substrate are opposite to each other between the unit exposure regions in which the exposure sequence is continuous.

The relative movement directions (scan directions) of the photo mask and substrate are changed depending on the unit exposure regions. Therefore, the supply/discharge functions of the pair of the liquid immersion medium fluid supply and discharge devices 36 are complementarily changed to be supply/discharge according to the scan direction so that an orientation of the liquid immersion medium fluid flow is changed. In addition, it is possible that one of the cleaning devices 38 is operated according to the scan direction so that a cleaning solution may be supplied from the one cleaning device 38 into the fence 35 via the corresponding liquid immersion medium fluid supply and discharge device 36, and the liquid immersion medium fluid supply and discharge device 36 connected to the other inactive cleaning device 38 is operated so that the cleaning solution after being used may be discharged from the fence 35 by means of the other liquid immersion medium fluid supply and discharge device 36.

A pattern region on the photo mask may be restricted by means of a diaphragm called a mask blind. A region of a resist film on which a latent image corresponding to the mask pattern on the photo mask is to be formed (unit exposure region) may be called an exposure shot.

Now, cleaning after exposure will be described. Function water such as ozone water, ionized water, carbonated water, or peroxide water is used as a cleaning solution. Alternatively, acid is used as a cleaning solution. However, when acid is used as a cleaning solution, the lens surface is corroded so that the lens performance may change. Thus, it is preferable that function water be used as a cleaning solution. In addition, cleaning may be carried out with water vapor.

The cleaning solution is supplied into the fence 35 in a state in which cavities are provided. It is preferable that the cavities be micro-cavities whose average in diameter is 1 μm or less. The micro-cavities have long service life, and are unlikely to disappear before they reach the top of the substrate.

Figure 2:
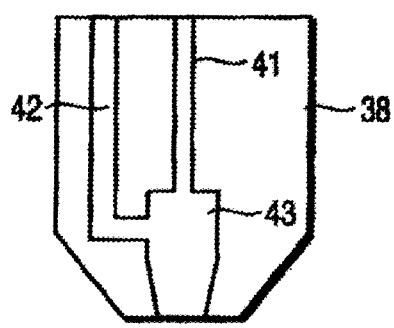
FIG. 2 is a view showing an example of a cleaning device according to the first embodiment of the present invention.
Figure 3:
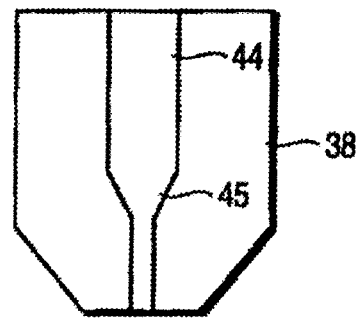
FIG. 3 is a view showing another example of the cleaning device according to the first embodiment of the present invention.

An ultrasound wave, a water jet, or a cavitation jet can be used in order to generate cavities in a cleaning solution. For example, cavities are generated in the cleaning solution by means of a cavitation jet nozzle shown in FIG. 2 or a venturi tube shown in FIG. 3. In FIG. 2, reference numeral 41 denotes a high pressure water nozzle from which a high pressure cleaning solution flows; reference numeral 42 denotes a low pressure nozzle from which a low pressure cleaning solution flows; and reference numeral 43 denotes a mixing portion. In FIG. 3, reference numeral 44 denotes a low speed flow section, and reference numeral 45 denotes a high speed flow section.

The cavitation jet nozzle of FIG. 2 is disclosed in detail in transactions of Japanese Machinery Society (Edition B), Volume 67, Issue 653 (2001-1), pp. 88, Transaction No. 00 to 0620. In general, cavitation jet cleaning is a cleaning method efficiently utilizing a physical force from which there occurs a cavitation phenomenon usually desired to be avoided in fluid engineering. If a pressure lower than a saturated vapor pressure is generated in fluid, cavities occur. The cavities are destroyed if the pressure in the fluid is returned to a pressure higher than the saturated vapor pressure, and at this time, a high pressure is momentarily generated.

The cavitation jet shown in FIG. 2 is designed so that a speed difference in water flow occurs on a boundary between the high speed water discharged from the high pressure nozzle 41 and the low speed water discharged from the low pressure nozzle 42.

The venturi tube 38 of FIG. 3 can be used as a device for generating cavities. When a fluid passes from a nozzle 44 having a large aperture via a nozzle 45 having a small aperture, cavities occur in the fluid, since the speed of the fluid changes from a low speed at the nozzle 44 to a high speed at the nozzle 45.

Figure 4:
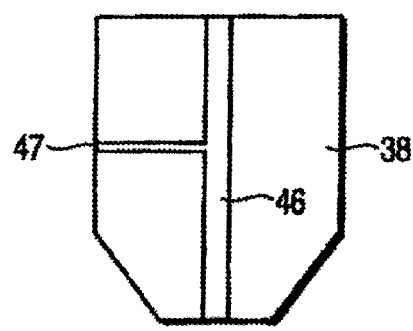
FIG. 4 is a view showing another example of the cleaning device according to the first embodiment of the present invention.

In addition, a Pitot tube of FIG. 4 can be used as a device for generating cavities. In FIG. 4, reference numeral 46 denotes a high pressure nozzle, and reference numeral 47 denotes a low pressure nozzle.

During cleaning, a cleaning solution containing cavities is supplied from the cleaning device 38 into the fence 35, while the stage 34 on which the semiconductor substrate 10 is placed is moved and accordingly the semiconductor substrate 10 is moved. Cleaning is carried out while moving the semiconductor substrate 10, thereby making it possible to clean parts or portions having been contacted with the liquid immersion medium fluid used during exposure. The parts or portions having been contacted with the liquid immersion medium fluid include the projection lens system 33, the fence 35, the object base 37, the stage 34, and the liquid immersion medium fluid supply and discharge devices 36.

Now, a cleaning period will be described. For example, after exposure has been carried out for a predetermined time, a cleaning process is carried out. In one option, a measuring instrument for measuring intensity of light transmitting the projection lens system 33 (exposure light wavelength is preferable) is provided at the liquid immersion exposure tool, and the light intensity is measured by means of the measuring instrument after exposure has started so that a cleaning process may be carried out when the measured light intensity becomes smaller than a preset value. In another option, in addition to the above-described measuring mechanism, there are further provided: a computing mechanism for computing a lowered quantity of light intensity from information on the light intensity measured by the measuring mechanism; and a calculating mechanism for calculating a cleaning period from the computed lowered quantity of light intensity, for carrying out the cleaning process in a computed cleaning period.

In addition, after the cleaning process has been carried out, a rinse process may be carried out using a rinse solution in which no cavities exist. By supplying the rinse solution, the cleaning solution which remains in the liquid immersion exposure tool can be removed. Water is used as a rinse solution. For example, by supplying water as a rinse solution from the liquid immersion medium fluid supply and discharge device 36, the inside of the liquid immersion exposure tool is rinsed, thereby removing the cleaning solution which remains in the liquid immersion exposure tool.

A cleaning process is carried out using the above-described cleaning device, thereby making it possible to remove the cloudiness of the lens and to recover the resolution and luminescence. In addition, the substance or impurities adhered to the lens or members of the tool during exposure can be removed, and an object surface can be restricted from being contaminated.

In addition, the liquid immersion exposure tool comprises a cleaning device, thereby making it possible to facilitate a cleaning process and to reduce a maintenance time. By reducing the maintenance time, an equipment operation time is enhanced, and a manufacturing cost of a manufactured semiconductor element can be reduced.

(Second Embodiment)

Figure 5:
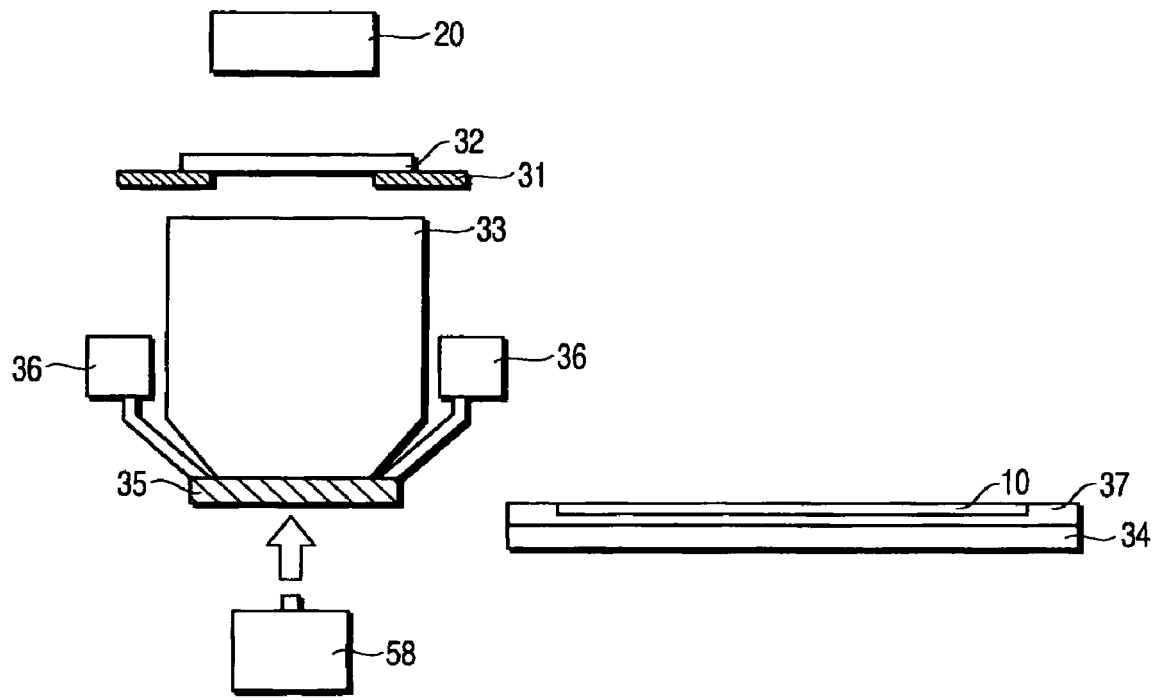
FIG. 5 is a view showing a configuration of a liquid immersion exposure tool according to a second embodiment of the present invention.

The present embodiment shows an example which is different from that of the liquid immersion exposure tool shown in FIG. 1. FIG. 5 is a view showing a liquid immersion exposure tool according to a second embodiment of the present invention. The same elements are designated by the same reference numerals. A duplicate description is omitted here.

In the liquid immersion exposure tool shown in FIG. 5, a cleaning device 58 is provided to be opposed to a substrate face of the projection lens system 33. The cleaning device 58 is detachable from the liquid immersion exposure tool.

(Third Embodiment)

Figure 6:
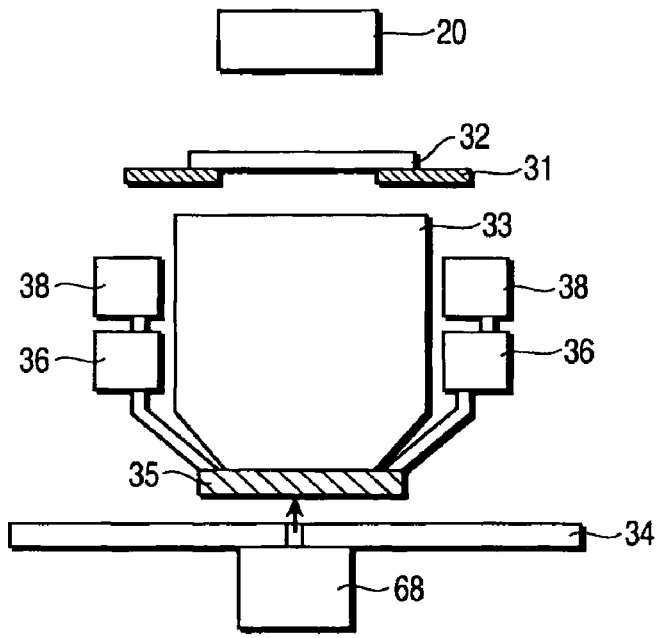
FIG. 6 is a view showing a configuration of a liquid immersion exposure tool according to a third embodiment of the present invention.

The present embodiment shows another example which is different from that of the liquid immersion exposure tool shown in FIG. 1. FIG. 6 is a view showing a liquid immersion exposure tool according to a third embodiment of the present invention. The same elements are designated by the same reference numerals. A duplicate description is omitted here.

In the liquid immersion exposure tool shown in FIG. 6, a cleaning device 68 is provided at the back surface of the stage 34, and the cleaning device 68 moves together with the stage 34.

(Fourth Embodiment)

FIG. 7 and FIG. 8 are views showing a liquid immersion exposure tool according to a fourth embodiment of the present invention. FIG. 7 shows a configuration of the liquid immersion exposure tool at the time of exposure, and FIG. 8 shows a configuration of the liquid immersion exposure tool at the time of cleaning. The same parts or components as those in the first to third embodiments are designated by the same reference numerals, and the description thereof is omitted.

A liquid supply device 76 and a liquid discharge device 79 are provided and connected to a fence 35. The liquid supply device 76 supplies a liquid into the fence 35, and the liquid discharge device 79 discharges the liquid from the fence 35. The structures of the liquid supply device 76 and the liquid discharge device 79 are not limited. The fence 35, the liquid supply device 76, and the liquid discharge device 79 are called a head unit.

At the time of exposure, the space between the substrate 10 and the optical lens system 33 is filled with a liquid immersion medium fluid supplied from the liquid supply device 76. Exposure light emitted from the optical lens system 33 reaches an irradiation region through the liquid immersion medium fluid, so that a mask pattern (a semiconductor device pattern) on the reticle 32 is projected on a photoresist film on a surface of the substrate, which is in the irradiated region, to thereby form a latent image on the photoresist film.

A cleaning device 38 is connected to the liquid supply device 76, and the cleaning device 38 supplies, for example, ultrapure water, as a cleaning solution into the fence 35 via the liquid supply device 76. Further, the cleaning device 38 generates cavities (air bubbles) in the cleaning solution. The liquid supply device 76 may be configured to supply ultrapure water.

The cleaning device 38 generates cavities in the cleaning solution by using an ultrasound wave, a water jet, or a cavitation jet, etc. It is preferable that the cavities are microcavities whose average in diameter is to 1 μm or less, and which have long service life and are unlikely to disappear before the cavities reach the substrate. The devices shown in FIGS. 2 to 4 can be used as a device for generating cavities.

In this embodiment, as shown in FIG. 8, an ozone gas supply portion 82 is provided immediately beneath a portion of the stage 34 where the head unit contacts. At the time of cleaning, ozone gas is directly supplied into the fence 35 from the ozone gas supply device 84 via the ozone gas supply portion 82.

The ozone gas supplied from the ozone gas supply device 84 via the ozone gas supply portion 82 dissolves into the cleaning solution in the fence 35, whereby ozone water is formed. Moreover, cavities are generated in the ozone water by the cleaning device 38, and the optical lens system 33 and the head unit are cleaned with the ozone water containing cavities. By using ozone water, the lens surface can be effectively cleaned without being damaged. In addition, since the ozone water contains cavities, the cleaning effect is improved.

Ozone water is stable in a liquid state under pressure, or at an extremely low temperature. However, ozone water is vaporized in a state not under pressure, or in a state under increased temperature.

Accordingly, in a case of a system in which ozone water is led into the fence from a long distance, the pipe extending to the lead-in portion must be maintained in a state under pressure, and the temperature must be maintained at a low temperature. However, it is difficult to realize these requirements.

To avoid the difficulty as described above, the present embodiment has the following configuration, as shown in FIG. 8. That is, the ozone gas supply portion 82 is provided immediately beneath portions to be cleaned, so that an ozone gas is directly supplied to the region surrounded by the fence 35 and the ozone gas is dissolved into the cleaning solution, that generates ozone water. Cleaning is performed in a state in which the cleaning solution has become ozone water, while generating cavities in the ozone water in the fence 35 by the cleaning device 38. In this way, the difficulty in realization by the above-described lead-in system is solved.

Figure 9:
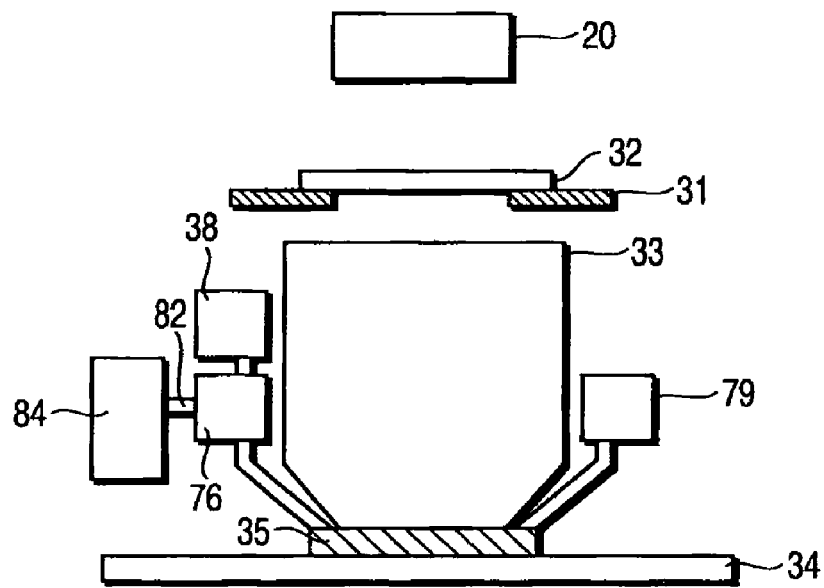
FIG. 9 is a view showing another configuration at the time of cleaning of the liquid immersion exposure tool according to the fourth embodiment of the present invention.

As another configuration of the present embodiment, as shown in FIG. 9, the ozone gas supply portion 82 is connected to the liquid supply device 76 to introduce ozone gas into the liquid supply device 76 through the ozone gas supply portion 82 from the ozone gas supply device 84, whereby a cleaning solution, for example, ultrapure water, may be made to be ozone water in the liquid supply device 76. In any case, ozone gas is supplied to the portion near to the objects to be cleaned such as the optical lens system 33, the stage 34, and the fence 35, etc. which have been contacted with the medium fluid used at the time of liquid immersion exposure. Consequently, cleaning by ozone water can be attained, and the optical lens system 33, the stage 34, and the fence 35 can be effectively cleaned, with the lens surface being not damaged.

Since in this embodiment ozone gas is supplied to the region to be cleaned from the portion near to the region to be cleaned, it is possible to carry out cleaning process without damaging the lens surface. This cleaning process makes it possible to remove fog over the lens, which can improve the resolution of the optical lens system 33. At the same time, substances and contaminations adhered to the lens or members of the tool at the time of liquid immersion exposure can be removed, which makes it possible to reduce contamination on an object surface.

After the cleaning process has been performed, rinsing may be carried out using a rinse solution, for example, water, in which no ozone and cavities exist. By supplying the rinse solution, the cleaning solution remaining in the liquid immersion exposure tool can be removed. For example, the rinse process may be carried out by supplying water from the liquid supply device 36.

In a case of a configuration of FIG. 9, cleaning can be performed while moving the substrate 10 in the same way as in the time of liquid immersion exposure of the device shown in FIG. 7, so that the object base 37 and the like can be cleaned.

(Fifth Embodiment)

Figure 10:
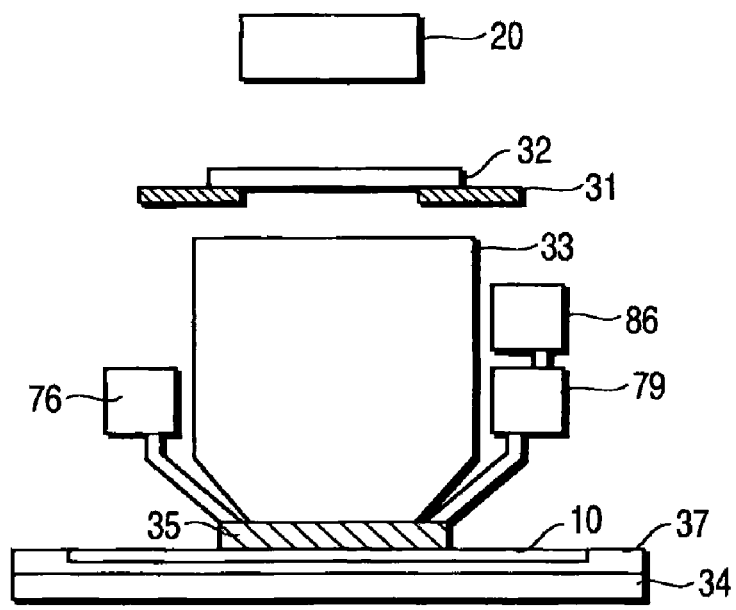
FIG. 10 is a view showing a configuration at the time of exposure of a liquid immersion exposure tool according to a fifth embodiment of the present invention.

FIG. 10 is a view showing a configuration at the time of exposure of a liquid immersion exposure tool according to a fifth embodiment of the present invention. In the same way as the configuration of the liquid immersion exposure tool shown in FIGS. 7 and 8, there are provided a lighting optical system (light source) 20, a reticle stage 31, a reticle 32, an optical lens system (projection lens system) 33, a stage 34, a fence 35, a liquid supply device 76, and a liquid discharge device 79.

In the present embodiment, a dissolved gas concentration meter 86 is further provided and connected to the liquid supply device 79. The dissolved gas concentration meter 86 monitors during exposure a concentration of the dissolved gas (for example, nitrogen, oxygen, or the like) contained in the liquid immersion medium fluid discharged from the fence 35 by the liquid supply device 79.

At the time of exposure, the space between the substrate 10 and the optical lens system 33, which is in a region surrounded by the fence 35, is filled with a layer of a liquid immersion medium fluid, for example, water. Exposure light emitted from the optical lens system 33 reaches an irradiation region through the liquid immersion medium fluid layer. An image of the mask pattern (semiconductor device pattern) on the reticle 32 is projected on a portion of a photo resist on the substrate surface, which portion corresponds to an irradiation region, so that a latent image is formed in the photo resist film.

In some cases, the liquid immersion medium fluid may be forced out of the wafer during a process of carrying out the liquid immersion exposure, for example, when an edge of the wafer is exposed by the exposure head. In such a case, air existing in a gap between the wafer cassette (object base) and the wafer is introduced in the liquid immersion medium fluid, and dissolved in the liquid immersion medium fluid. When the air dissolved in the liquid immersion medium fluid excesses over a given amount, there is a possibility that bubbles are generated about in the liquid immersion medium fluid due to a rise in temperature occurred by light irradiation at the time of exposure, which makes the exposure defective.

It is possible to judge whether or not the liquid immersion medium fluid for liquid immersion exposure is under the appropriate condition by monitoring whether or not the concentration of the dissolved gas (for example, nitrogen, oxygen, or the like) in the liquid immersion medium fluid discharged from the fence 35 by the liquid supply device 79 is a predetermined concentration or less, for example, 0.1 ppm or less.

When it is judged during the exposure that the above-described condition is not satisfied, it is determined that abnormality has been detected, and a re-work is carried out, that is, a re-coating of resist is performed and a lithography process is again performed. After the lithography process has been performed, the concentration of the dissolved gas is monitored with the dissolved gas concentration meter 86 again. When it is judged that the condition in which the concentration of the dissolved gas is a predetermined concentration or less, for example, 0.1 ppm or less, is satisfied so that no abnormality is detected, the liquid immersion exposure is re-started.

Figure 11:
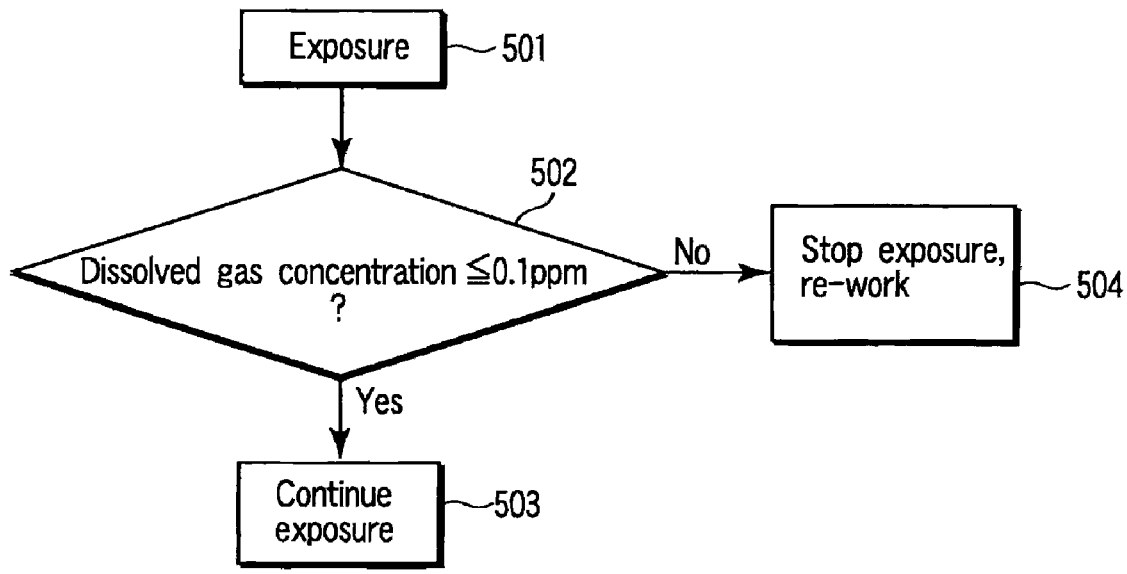
FIG. 11 is a flowchart of a liquid immersion exposure method according to the fifth embodiment of the present invention.

FIG. 11 is a flowchart showing an example of the liquid immersion exposure method in the just-mentioned case. During the exposure (step 501), the concentration of the gas dissolved in the liquid immersion medium fluid discharged from the fence by the liquid supply device 79 is monitored by the dissolved gas concentration meter 86 in appropriate timings or continuously, and it is judged whether or not the condition is satisfied in which the concentration of the dissolved gas is a predetermined concentration or less, for example, 0.1 ppm or less (step 502). When the condition is not satisfied, the exposure is stopped, and re-work is carried out, that is, a re-coating of resist is performed and a lithography process is again performed (step 504). When the condition is satisfied, the exposure is continued (step 503).

Figure 12:
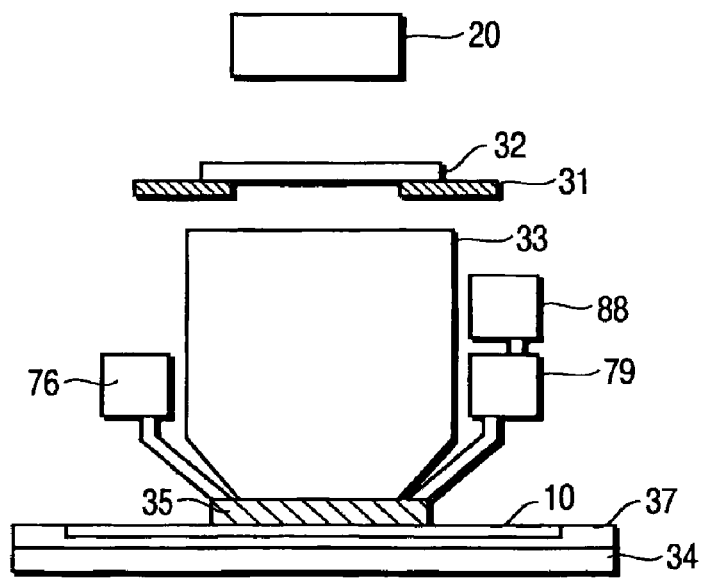
FIG. 12 is a view showing another configuration at the time of exposure of the liquid immersion exposure tool according to the fifth embodiment of the present invention.

Further, as shown in FIG. 12, a particle counter 88 may be connected to the liquid discharge device 79, in place of the dissolved gas concentration meter 86. The particle counter 88 monitors particles including gas (air bubbles) as a laser scatter or contaminants in a liquid, for example, in the liquid immersion medium fluid. The particle counter 88 monitors whether or not a particle density is a predetermined density, for example, one piece/ml or less, and detects an abnormal when the particle density is greater than the predetermined density. It is difficult for an existing particle counter to distinguishably count particles and bubbles in the liquid. However, because both of particles and bubbles affect the liquid immersion exposure, the above-described detection of abnormality by the particle counter 88 is effective.

When the liquid immersion exposure is carried out onto the edge of the wafer, for example, as described above, air existing in a gap between the wafer cassette (object base) and the wafer may be introduced as air bubbles into the liquid immersion medium fluid, or contaminants adhered to the wafer edge may be introduced into the liquid immersion medium fluid by friction at the time of handling the wafer.

When a large amount of gas (air bubbles) as a laser scatter and/or particles including contaminants is contained in the liquid immersion medium fluid, the exposure results in failure. Therefore, it is advantage to monitor the amount of gas and/or particles and determine whether or not the liquid immersion medium fluid is under an appropriate condition for exposure.

Figure 13:
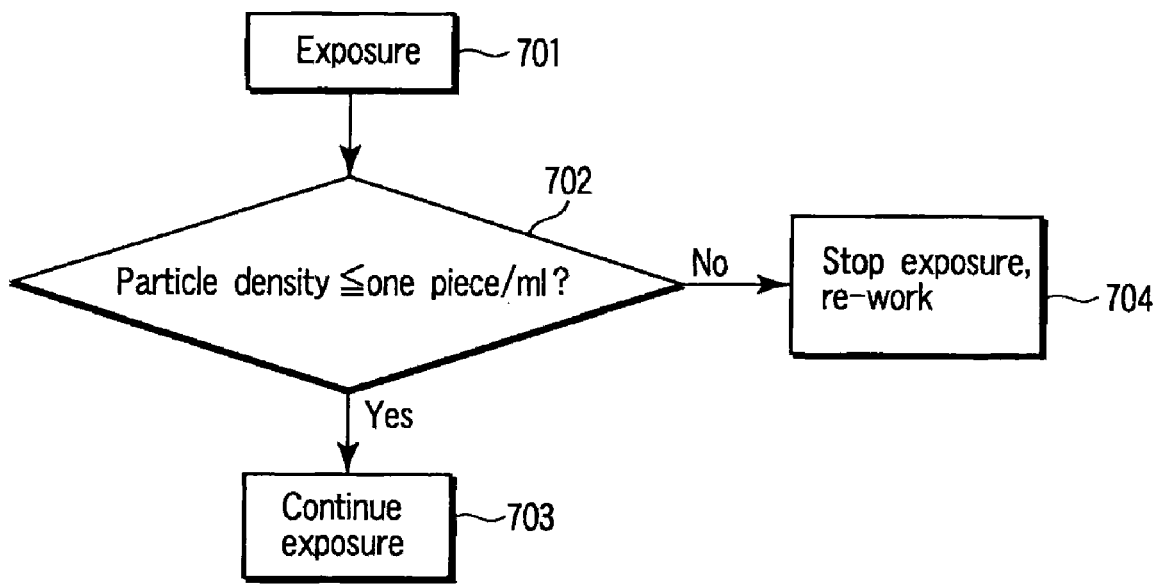
FIG. 13 is a flowchart of a liquid immersion exposure method according to the fifth embodiment of the present invention.

FIG. 13 is a flowchart showing an example of the liquid immersion exposure method in the just-mentioned case. During the exposure (step 701), the density of the particle contained in the liquid immersion medium fluid discharged from the fence 35 by the liquid supply device 79 is monitored by the particle counter 88 in appropriate timings or continuously, and it is determined whether or not the condition is satisfied in which the particle density is a predetermined density, for example, one piece/ml or less (step 702). When the condition is not satisfied, the exposure is stopped, and a re-work is carried out, that is, that is, a re-coating of resist is performed and a lithography process is again performed (step 704). When the condition is satisfied, the exposure is continued (step 703).

Figure 14:
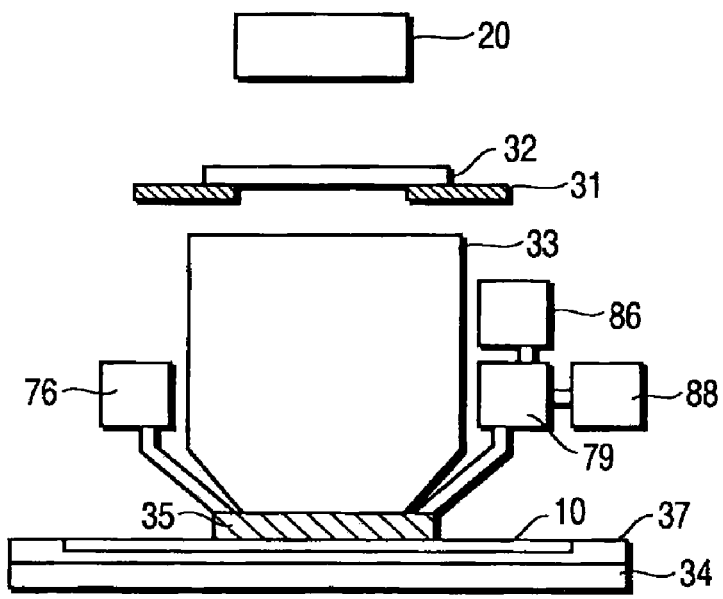
FIG. 14 is a view showing a further configuration at the time of exposure of the liquid immersion exposure tool according to the fifth embodiment of the present invention.

Moreover, as shown in FIG. 14, both of the dissolved gas concentration meter 86 and the particle counter 88 may be connected to the liquid discharge device 79. In this case, for example, when the both of the condition in which the concentration of the dissolved gas in the discharged liquid immersion medium fluid is 0.1 ppm or less and the condition in which the particle density in the discharged liquid immersion medium fluid is one piece/ml or less are satisfied, exposure is started or continued, and when any of the conditions is not satisfied, exposure is cancelled, so that the liquid immersion exposure can be executed under an appropriate exposure environment.

Figure 15:
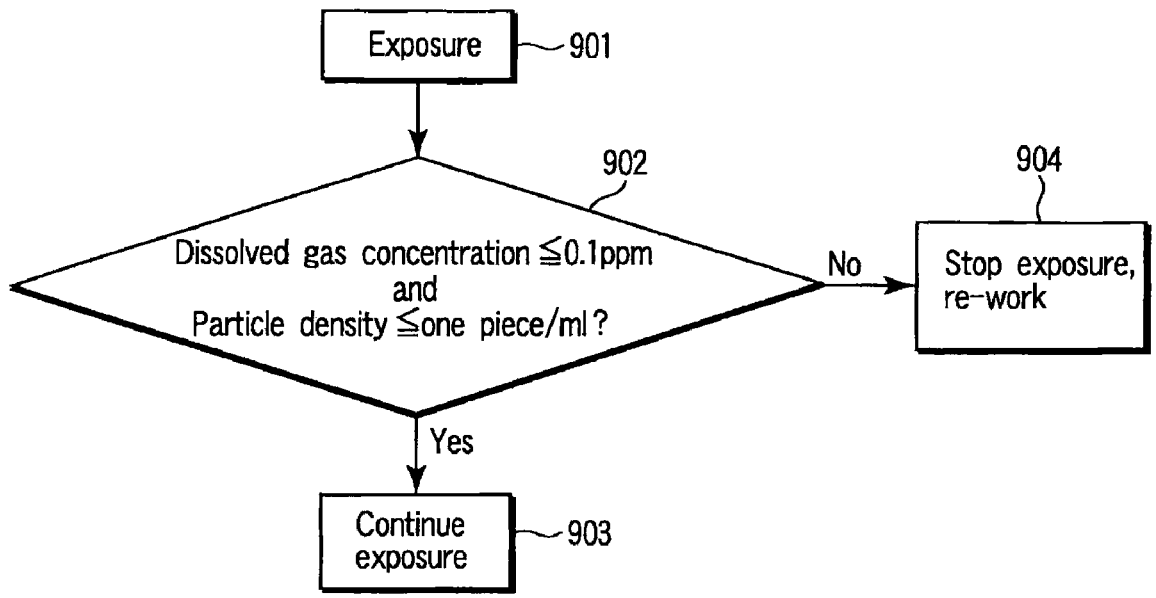
FIG. 15 is a flowchart of a liquid immersion exposure method according to the fifth embodiment of the present invention.

FIG. 15 is a flowchart showing an example of the liquid immersion exposure method in the just-mentioned case. During the exposure (step 901), the dissolved gas concentration and the particle density in the discharged liquid immersion medium fluid are monitored by the dissolved gas concentration meter 86 and the particle counter 88 in appropriate timings or continuously, and it is judged whether or not the conditions that the dissolved gas concentration is a predetermined concentration, for example, 0.1 ppm or less, and that the particle density is a predetermined density, for example, one piece/ml or less are satisfied (step 902). When the conditions are not satisfied, the exposure is stopped, and a re-work is carried out, that is, a re-coating of resist is performed and a lithography process is again performed (step 904). On the other hand, when the conditions are satisfied, the exposure is continued (step 903).

As described above, in accordance with the present embodiment, it is possible to immediately detect during the exposure the fact that the liquid provided between the lens and the wafer is not clean. Consequently, the liquid immersion exposure processing which may result in failure finally is rapidly stopped, and the lithography process can be performed again. As a result, the work efficiency is improved, which makes it possible to reduce the cost of manufacturing semiconductor devices to be manufactured.

(Sixth Embodiment)

Figure 16:
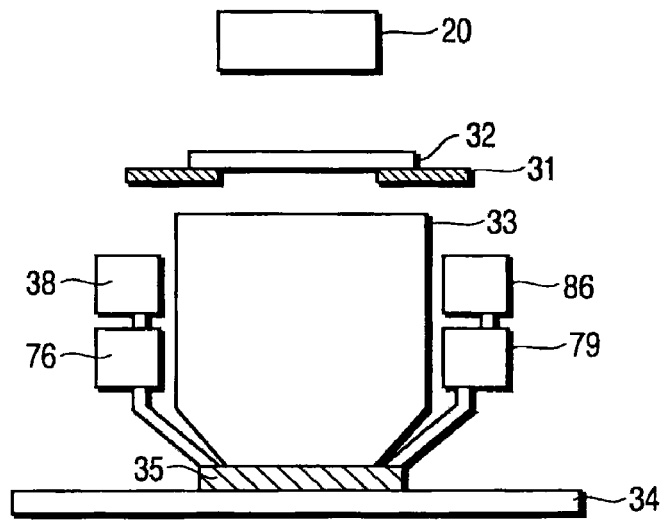
FIG. 16 is a view showing a configuration at the time of cleaning of a liquid immersion exposure tool according to a sixth embodiment of the present invention.

FIG. 16 is a view showing a configuration at the time of cleaning of a liquid immersion exposure tool according to a sixth embodiment of the present invention. In the configuration of the present embodiment, a cleaning device 38 is further provided as compared with the configuration of FIG. 10 according to the fifth embodiment of the present invention. The cleaning device 38 is connected to the liquid supply device 76. FIG. 16 shows a situation in which the liquid immersion exposure tool is operating in a region of the stage 34 where there is no semiconductor substrate.

In the present embodiment, portions upper than the head unit are moved after the exposure to the region of the stage 34 where there is no substrate in order to clean the optical lens system 33 and the head unit. Then, a cleaning solution such as ozone water containing cavities is supplied into the fence 35 through the liquid supply device 76 from the cleaning device 38, so that portions including the optical lens system 33 which have been contacted with the liquid immersion medium fluid are cleaned by the cleaning solution containing cavities.

Thereafter, the cleaning solution remaining in the liquid immersion exposure tool is removed by supplying a rinse solution, for example, water, into the fence 35. However, conventionally, there is no means for confirming whether or not the cleaning solution has been sufficiently removed by the rinse solution. In the present embodiment, a concentration of ozone or the like included in the rinse solution discharged from the fence by the liquid discharge device 79, i.e., the rinse solution after being used for rinsing, can be monitored by the dissolved gas concentration meter 86 connected to the liquid discharge device 79.

Accordingly, it is possible to confirm whether or not the cleaning solution has been sufficiently removed by the rinse solution. When it is confirmed that the cleaning solution has been sufficiently removed, liquid immersion exposure is started, and otherwise, the rinsing is continued, as it is determined that abnormality has been detected.

Moreover, even after it is confirmed by the dissolved gas concentration meter 86 that the concentration or the like of ozone in the rinse solution is the predetermined concentration or less, the monitoring may be continued during the supply of the liquid immersion medium fluid from the liquid supply device 76 to determine whether or not the liquid immersion medium fluid is under an appropriate condition for liquid immersion exposure.

Alternatively, ultrapure water may be used as both of the rinse solution and the liquid immersion medium fluid. In such a case, ultrapure water is continued to flow, and the dissolved gas concentration in the discharged water is monitored using the dissolved gas concentration meter 86. When the dissolved gas concentration is made to be a predetermined concentration or less, for example, 0.1 ppm or less, the liquid immersion exposure is started. In this manner, liquid immersion exposure can be executed under an appropriate exposure environment after cleaning.

Figure 17:
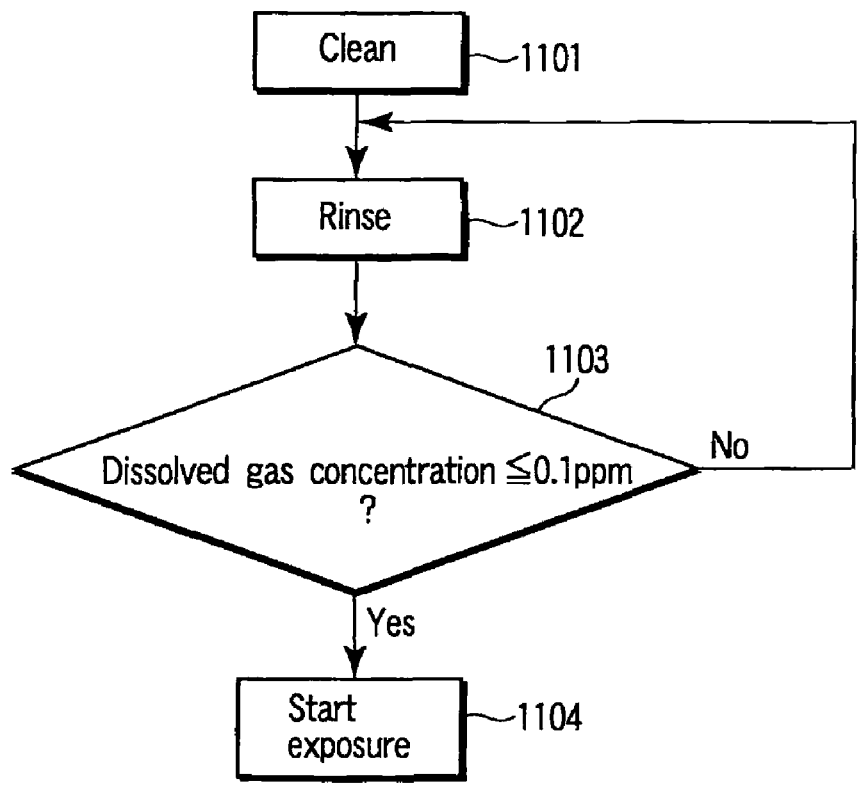
FIG. 17 is a flowchart of a liquid immersion exposure method according to the sixth embodiment of the present invention.

FIG. 17 is a flowchart showing an example of a liquid immersion exposure method in the above-mentioned case. After cleaning by a cleaning solution (step 1101), rinsing is performed with a rinse solution (step 1102). While rinsing is being performed, the dissolved gas concentration in the rinse solution after being used for rinsing is monitored by the dissolved gas concentration meter 86 in appropriate timings or continuously, and it is determined whether or not the condition is satisfied in which the dissolved gas concentration is a predetermined concentration, for example, 0.1 ppm or less (step 1103). When it is determined that the condition is not satisfied, rinsing is continued, and when it is determined that the condition is satisfied, exposure is started (step 1104).

Figure 18:
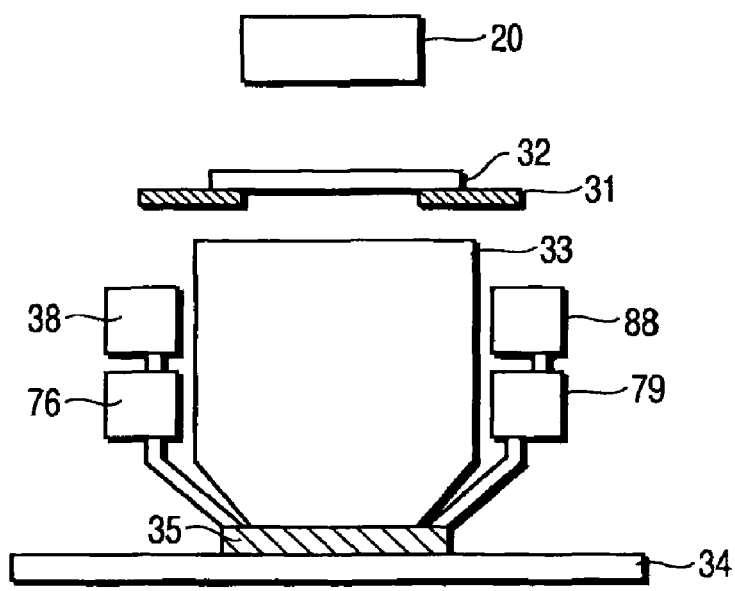
FIG. 18 is a view showing another configuration at the time of cleaning of the liquid immersion exposure tool according to the sixth embodiment of the present invention.

In addition, as shown in FIG. 18, a particle counter 88 may be connected to the liquid discharge device 79, in place of the dissolved gas concentration meter 86. The particle density of the discharged rinse solution, i.e., the rinse solution after being used for rinsing is monitored by the particle counter 88 to determine whether or not the particle density is a predetermined density, for example, one piece/ml or less. When it is determined that this condition is satisfied, the liquid immersion exposure is started.

Figure 19:
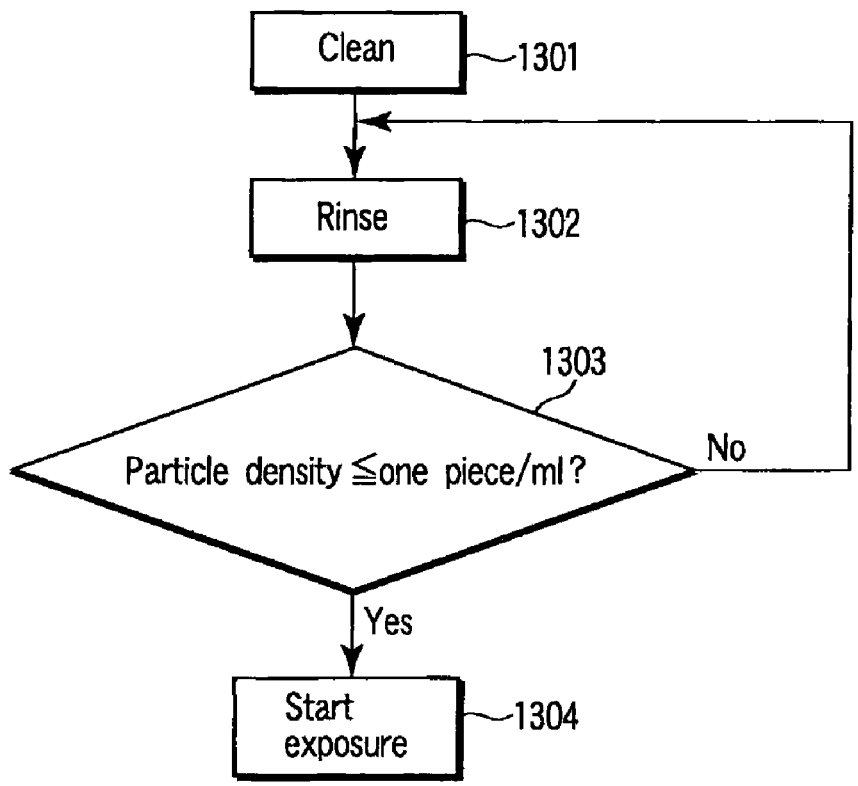
FIG. 19 is a flowchart of a liquid immersion exposure method according to the sixth embodiment of the present invention.

FIG. 19 is a flowchart showing an example of a liquid immersion exposure method in the just-mentioned case. After cleaning by a cleaning solution (step 1301), rinsing is performed with a rinse solution (step 1302). While rinsing is being performed, the particle density in the discharged rinse solution, i.e., the rinse solution after being used for rinsing is monitored by the particle counter 88 in appropriate timings or continuously, and it is determined whether or not the condition is satisfied in which the particle density is a predetermined density, for example, one piece/ml or less (step 1303). When it is determined that the condition is not satisfied, the rinsing is continued, and when it is determined that the condition is satisfied, exposure is started (step 1304).

Figure 20:
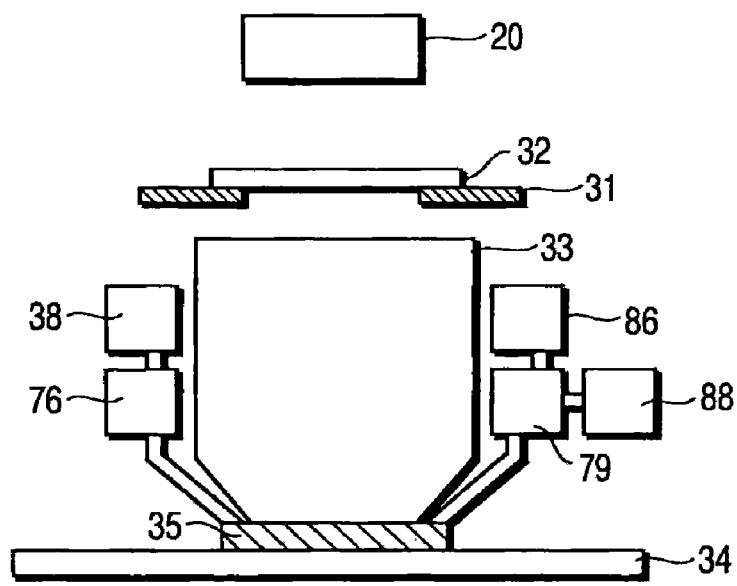
FIG. 20 is a view showing a further configuration at the time of cleaning of the liquid immersion exposure tool according to the sixth embodiment of the present invention.

Further, as shown in FIG. 20, both of the dissolved gas concentration meter 86 and the particle counter 88 may be connected to the liquid discharge device 79. For example, only when the rinse solution discharged from the fence 35 by the liquid discharge device 79 satisfies the condition in which the dissolved gas concentration is 0.1 ppm or less, and the condition in which the particle density is one piece/ml or less, exposure is started, and exposure is not started when any of the both conditions is not satisfied, which makes it possible to execute liquid immersion exposure under an appropriate exposure environment.

FIG. 21 is a flowchart showing an example of a liquid immersion exposure method in the just-mentioned case. After cleaning by a cleaning solution (step 1501), rinsing is performed with a rinse solution (step 1502). While rinsing is being performed, the dissolved gas concentration in the rinse solution after being used for rinsing is monitored by the dissolved gas concentration meter 86 and the particle density in the rinse solution after being used for rinsing is monitored by the particle counter 88 in appropriate timings or continuously. Then, it is determined whether or not the conditions that the dissolved gas concentration is a predetermined concentration, for example, 0.1 ppm or less, and that the particle density is a predetermined density, for example, one piece/ml or less are satisfied (step 1503). When it is determined that the conditions are not satisfied, the rinsing is continued, and when it is determined that the conditions are satisfied, exposure is started (step 1504).

Moreover, ozone water is used as a cleaning solution, an ozone gas supply portion 82 and an ozone gas supply device 84 may be provided directly beneath portions to be cleaned as shown in FIG. 22.

Figure 23:
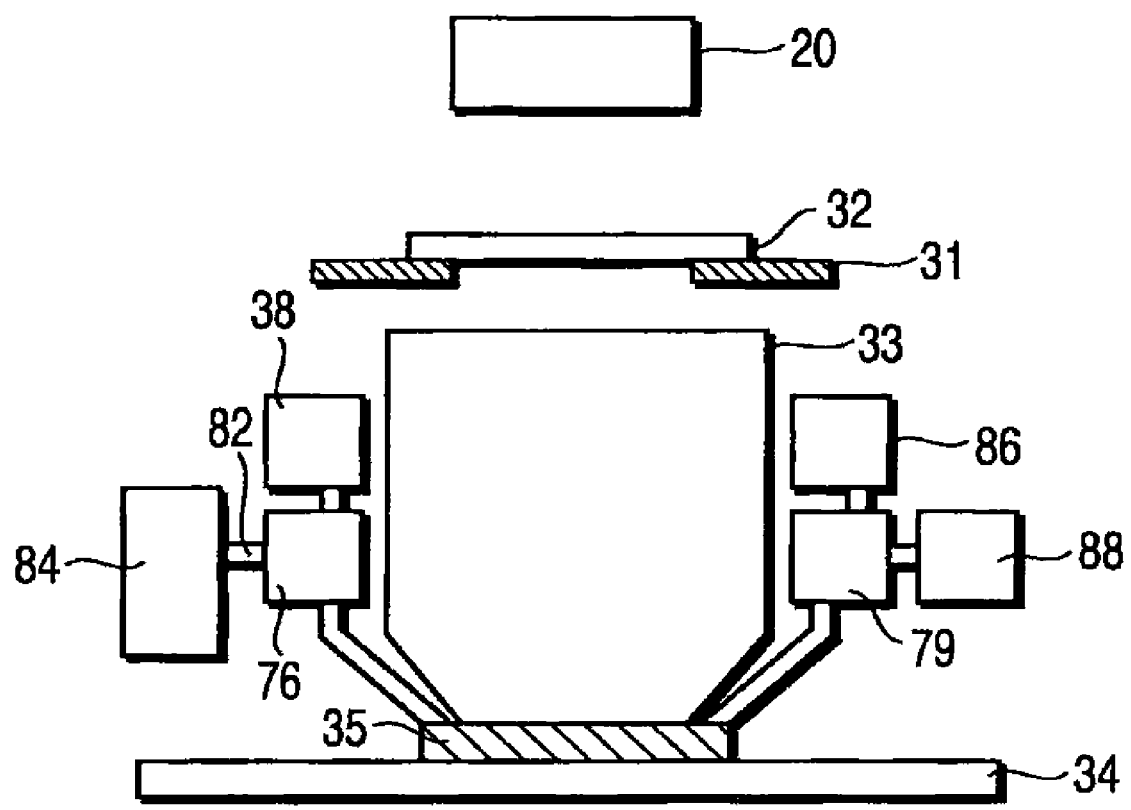
FIG. 23 is a view showing another configuration at the time of cleaning by ozone water, of the liquid immersion exposure tool according to the sixth embodiment of the present invention.

Alternatively, the ozone gas supply portion 82 and the ozone gas supply device 84 may be connected to the liquid supply device 76 as shown in FIG. 23. Moreover, a dissolved gas concentration meter 86 and a particle counter 88 may be provided.

As a consequence, cleaning by ozone water without damaging the lens surface can be easily attained so as to clean with a ozone concentration of the ozone water kept constant. At the same time, the ozone concentration and particles including ozone bubbles (air bubbles) can be monitored with the dissolved gas concentration meter 86 and the particle counter 88. Accordingly, the liquid immersion exposure can be excused after confirming that an appropriate exposure environment is established after cleaning.

Further, specifications of the particle density and the dissolved gas concentration described in the fifth and sixth embodiments vary depending on the liquid immersion exposure conditions to be used (flow rate of liquid, flow method, and the like).

In the above embodiments, examples of the liquid immersion exposure have been described. However, the present invention can be applied to liquid immersion type measuring for measuring a surface of an object.

According to the above-described embodiments, an optical lens system and a liquid immersion medium fluid discharge device or the like configuring the liquid immersion exposure tool can be cleaned, and the cloudiness of the optical lens system can be prevented. In addition, the impurities reaching an object surface are reduced, thereby making it possible to prevent contamination on the object surface.

While the above embodiments have described examples of the liquid immersion exposure tool, the above-described cleaning device is provided at a liquid immersion type microscope for observing a surface of an object, and a cleaning process may be carried out. Further, the above-described cleaning device is provided at a liquid immersion type measuring instrument for measuring a surface of an object, and a cleaning process may be carried out. That is, the above-described cleaning device is provided at any liquid immersion type equipment, and a cleaning process may be carried out.

In addition, while, in the above embodiments, water has been used as a liquid immersion medium fluid used during liquid immersion, a liquid immersion medium fluid other than water may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
an ozone gas supplying device which is provided beneath the stage and connected to the stage and supplies an ozone gas to the cleaning solution.

2. A liquid immersion optical tool according to claim 1, further comprising a measuring device which is connected to the liquid discharge device and measures at least one of a dissolved gas concentration and a particle density of the liquid immersion medium fluid or the cleaning solution discharged by the discharge device.

3. A liquid immersion optical tool according to claim 1, wherein the liquid supply device functions to generate cavities in the cleaning solution.

4. A liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution;
an ozone gas supplying device which is provided beneath the stage and connected to the stage and supplies an ozone gas to the cleaning solution; and
a measuring device which is connected to the liquid discharge device and measures at least one of a dissolved gas concentration and a particle density of the liquid immersion medium fluid or the cleaning solution discharged by the liquid discharge device.

5. A liquid immersion optical tool according to claim 4, wherein the liquid supply device functions to generate cavities in the cleaning solution.

6. A cleaning method which cleans an optical lens system in a liquid immersion optical tool comprising:
a light source;
the optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
an ozone gas supplying device which is provided beneath the stage and connected to the stage and supplies an ozone gas to the cleaning solution, the method comprising:
cleaning the optical lens system by the cleaning solution in which an ozone gas is dissolved by supplying the ozone gas from the ozone gas supplying device to the cleaning solution.

7. A cleaning method according to claim 6, further comprising generating cavities in the cleaning solution.

8. A cleaning method according to claim 6, further comprising rinsing after the cleaning with a rinse solution, measuring at least one of a dissolved gas concentration and a particle density of the rinse solution after being used.

9. A device manufacturing method, in which an exposure is carried out with the liquid immersion optical tool of claim 1.

10. A liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution; and
an ozone gas supplying device which is connected to the liquid supply device via an ozone gas supply portion used only for ozone gas supply and supplies an ozone gas to the cleaning solution via the ozone gas supply portion.

11. A liquid immersion optical tool comprising:
a light source;
an optical lens system;
a stage which moves an object base on which an object is to be placed;
a liquid supply device which supplies a liquid immersion medium fluid or a cleaning solution between the optical lens system and the object;
a liquid discharge device which discharges the liquid immersion medium fluid or the cleaning solution;
an ozone gas supplying device which is connected to the liquid supply device via an ozone gas supply portion used only for ozone gas supply and supplies an ozone gas to the cleaning solution via the ozone gas supply portion; and
a measuring device which is connected to the liquid discharge device and measures at least one of a dissolved gas concentration and a particle density of the liquid immersion medium fluid or the cleaning solution discharged by the liquid discharge device.

12. A cleaning method which cleans an optical lens system in a liquid immersion optical tool comprising:
a light source;
an optical lens system;
a stage which moves an object base on which an object is to be placed;
a liquid supply device which supplies a liquid immersion medium fluid or a cleaning solution between the optical lens system and the object; and
an ozone gas supplying device which is connected to the liquid supply device via an ozone gas supply portion used only for ozone gas supply and supplies an ozone gas to the cleaning solution via the ozone gas supply portion, the method comprising:
cleaning the optical lens system by the cleaning solution in which an ozone gas is dissolved by supplying the ozone gas from the ozone gas supplying device to the cleaning solution.

* * * * *